United States Patent [19]

Stewart

[11] 4,080,539
[45] Mar. 21, 1978

[54] LEVEL SHIFT CIRCUIT

[75] Inventor: Roger Green Stewart, Neshanic Station, N.J.

[73] Assignee: RCA Corporation, New York, N.Y.

[21] Appl. No.: 740,679

[22] Filed: Nov. 10, 1976

[51] Int. Cl.² ............... H03K 5/02; H03K 17/04
[52] U.S. Cl. .................... 307/264; 307/270; 307/279; 307/DIG. 1
[58] Field of Search ............... 307/205, 214, 251, 264, 307/270, 279, 304, DIG. 1; 330/35

[56] References Cited

U.S. PATENT DOCUMENTS

| 3,654,561 | 4/1972 | Egawa et al. | 307/351 X |
| 3,675,144 | 7/1972 | Zuk | 307/251 X |
| 3,823,330 | 7/1974 | Rapp | 307/DIG. 1 X |
| 3,842,411 | 10/1974 | Naito | 307/DIG. 1 X |
| 3,906,254 | 9/1975 | Lane et al. | 307/DIG. 1 X |
| 4,000,412 | 12/1976 | Rosenthal et al. | 307/DIG. 1 X |
| 4,006,491 | 2/1977 | Alaspa et al. | 307/304 X |

FOREIGN PATENT DOCUMENTS 2,237,579   2/1974   Germany ............... 307/279

OTHER PUBLICATIONS

Elliott et al., "Regenerative TTL Receiver using Enhancement and Depletion FET Devices", IBM Tech. Discl. Bull.; vol. 18, No. 10, pp. 3259-3260, 3/1976.

Primary Examiner—Larry N. Anagnos
Attorney, Agent, or Firm—H. Christoffersen; H. I. Schanzer

[57] ABSTRACT

A gating means couples excitation signals to the input of an inverter which is connected between first and second power terminals. Positive feedback means is connected between the input and the output of the inverter. In response to an excitation signal, whose level is intermediate the levels of the operating voltages applied between the first and second power terminals, the inverter output is driven to the potential at one of the first and second power terminals while the potential at the other one of the first and second power terminals is applied to the inverter input. The gating means, conductive during transitions of the excitation signals from one level to another, does not conduct in the steady state condition, whereby a potential at the inverter input of higher amplitude than the excitation signals is not coupled back to the source of excitation signals.

12 Claims, 5 Drawing Figures

LEVEL SHIFT CIRCUIT

BACKGROUND OF THE INVENTION

This invention relates to level shift circuits.

It is often necessary and/or desirable to operate different parts of an electronic system at different voltage levels. At the places where the different parts interface, they must be coupled to each other. However, the signals at the interfaces are not necessarily compatible. It is, therefore, necessary to provide interface and level shift circuits which can render one part of the system compatible with the other. For an interface or level shift circuit to be useful it must be compatible with the other circuits of the system with respect, among other things, to speed of operation, and minimization of power dissipation.

SUMMARY OF THE INVENTION

Level shift circuits embodying the invention include an inverter connected between points of first and second operating voltages, with regenerative feedback connected between the input and output of the inverter. The regenerative feedback causes the inverter to latch up in a storage condition in response to the application at the inverter input of an excitation signal whose level is intermediate the first and second operating voltages. Gating means coupled between a signal source and the inverter input couples thereto excitation signals varying in potential between a first level and a second level intermediate the operating voltages. The gating means is conductive during the transition of an excitation signal from the first level to the second level for causing the inverter to latch up, and is non-conductive following the latch up of the inverter, thereby isolating the inverter from the source of excitation signal.

BRIEF DESCRIPTION OF THE DRAWINGS

The invention is best understood and explained with reference to the accompanying drawings in which like reference characters denote like components, in which insulated-gate field-effect transistors (IGFETs) are used to illustrate the invention and in which IGFETs of P-conductivity type are identified by the letter P followed by a reference numeral, and IGFETs of N-conductivity type are identified by the letter N-followed by a reference numeral; and in which.

DESCRIPTION OF THE PREFERRED EMBODIMENTS

Figure 1:
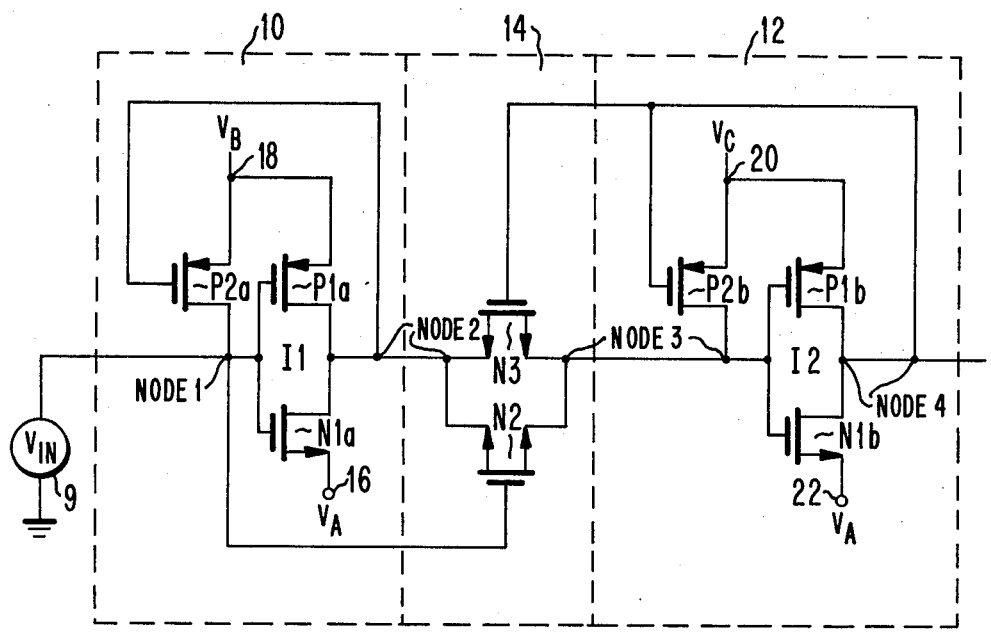
FIG. 1 is a schematic diagram of a level shift circuit embodying the invention.

The circuit of FIG. 1 includes two half-latch circuits 10, 12 and a gating network 14 for passing signals between the two latches.

Half-latch 10 has a signal input point connected to a node 1, a signal output point connected to a node 2 and two power terminals 16 and 18 to which are applied operating voltages $V_A$ and $V_B$, respectively. Latch 10 includes complementary inverter I1 comprising IGFETs P1a and N1a connected at their gates to input node 1, and at their drains to output node 2. The sources of transistor N1a and P1a are connected to terminals 16 and 18, respectively. Latch 10 also includes a positive feedback transistor P2a connected at its drain to node 1.

Half-latch 12, similar, schematically to latch 10, has a signal input point connected to a node 3, a signal output point connected to a node 4, and two power terminals 20 and 22 to which are applied $V_C$ and $V_A$ volts, respectively. Latch 12 includes complementary inverter I2 comprised of IGFETs P1b and N1b connected at their gates to input node 3 and at their drains to output node 4. The sources of IGFETs P1b and N1b are connected to terminals 20 and 22, respectively. A regenerative feedback IGFET P2b is connected at its gate to node 4, at its source to terminal 20 and at its drain to node 3. The "ON" impedance of the conduction paths of the feedback IGFETs (P2a and P2b) is much greater than the "ON" impedance of the conduction paths of the other IGFETs of the circuit.

The gating network 14 includes transistors N2 and N3 having their conduction paths connected in parallel between nodes 2 and 3. The gate electrode of transistor N2 is connected to node 1 and the gate electrode of transistor N3 is connected to node 4.

For purpose of the discussion to follow, it will be assumed that $V_A$ is ground or reference potential, that $V_B$ is +5 volts, and that $V_C$ is +15 volts. It is also assumed that a source 9 of the input signals ($V_{IN}$) is connected to the signal input terminal node 1, and that the input signals vary in amplitude between $V_A$ and $V_B$ volts.

The operation of the circuit may be explained by arbitrarily selecting an initial state and then going through a full operating cycle. Assume initially, that $V_{IN}$ applied to node 1 is at 5 volts ($V_B$), that node 2 is then at 0 volts ($V_A$), that node 3 is also at, or close to, 0 volts due to conduction via the conduction paths of transistors N2 and N3, and that node 4 is at 15 volts ($V_C$).

A transition occurs when $V_{IN}$ goes from $V_B$ to $V_A$ volts. As $V_{IN}$ goes from $V_B$ to $V_A$, transistor N1a is being turned off and transistor P1a is being turned on. Typically as $V_{IN}$ is half way between $V_B$ and $V_A$, the tripping or switching point of inverter $I_1$ is reached.

When $V_{IN}$ reaches a value which is less than the threshold ($V_{TN}$) of transistor N1a (which is assumed to be 1.0 volt), it turns off and transistor P1a is fully on, causing the potential at node 2 ($V_2$) to go to $V_B$ volts. When node 2 is at $V_B$ volts, transistor P2a, whose gate is connected to node 2, is turned off, which breaks the conduction path between node 1 and the $V_B$ volts applied to terminal 18. Input source 9 can then easily pull node 1 all the way down to 0 volts. With node 1 at $V_{TN}$ volts or less, gating transistor N2 is also turned off.

When $V_2$ initially rises towards $V_B$ volts, IGFET N3 is on hard since $V_C$ volts is applied to its gate at node 4. IGFET N3 then exhibits a very low impedance conduction path between its drain and source, and couples the rising potential at node 2 to node 3 with substantially no attenuation. As the potential at node 3 ($V_3$) rises, transistor N1b begins to turn on and transistor P1b begins to turn off, causing the potential at node 4 ($V_4$) to decrease towards $V_A$ volts. As $V_4$ decreases, transistor P2b with its gate connected to node 4 begins to be turned on and provides a conduction path between node 20, to which $V_C$ is applied, and the gates of transistors P1b and N1b. This in turn causes transistor N1b to be turned on more and transistor P1b to be turned off more, which in turn causes $V_4$ to decrease more and transistor P2b to be turned on harder. The effect of the regenerative (or positive) feedback provided by transistor P2b is to drive N1b full on, P1b full off, $V_3$ to $V_C$ volts and $V_4$ to $V_A$ volts.

Concurrently with the above, as $V_4$ decreases, transistor N3 is being turned off. Transistor N3 is fully turned off when the potential at its source and drain reaches approximately $V_B$ volts and the potential at its gate ($V_4$) decreases to within a threshold voltage ($V_T$) of $V_B$ volts. Thus, transistor N3 is being turned off by the rising potential at node 2 which it applies to the input of inverter I2, whose output $V_4$ causes the gate potential of N3 to decrease. When transistor N3 cuts off, all the current supplied via transistor P2b charges the gate capacitance of transistors P1b and N1b, further driving node 3 to $V_C$ volts and node 4 towards ground ($V_A$). It is important to recognize that turning off transistor N3 (N2 is already off) prevents a backflow of current or potential from node 3 to node 2. With transistor N3 turned off, node 3 can now be driven all the way to $V_C$ (15) volts via the conduction path of transistor P2b even though transistor P2b has a high impedance conduction path. This causes the output of latching means 12 to go to the $V_A$ level and to stay latched in that state.

Thus, for the condition of $V_A$(0) volts applied to node 1, node 2 is at $V_B$(5) volts, node 3 is at $V_C$(15) volts and node 4 is at $V_A$ volts. Node 3 is decoupled from node 2 and no current flows between those two nodes. Node 2 is at $V_B$ volts and since transistors N1a and P1b are turned off, no current (except for leakage currents) flows in circuits 10 or 12.

A second transition is begun when $V_{IN}$ goes from $V_A$ towards $V_B$. As $V_{IN}$ rises, $V_2$ drops towards $V_A$, causing transistor P2a to turn on, and the potential at node 1 to go even higher towards $V_B$ volts, and further driving node 2 towards ground. As $V_{IN}$ increases towards $V_B$ volts, transistor N2 is turned on, causing node 3 to be clamped close to ground via the conduction paths of transistors N2 and N1a conducting in series. This occurs because the "ON" series impedances of transistors N1a and N2 is considerably less than the "ON" impedance of device P2b. With node 3 close to ground, transistor N1b is turned off and transistor P1b is turned on driving node 4 towards $V_C$ volts. As $V_4$ rises, transistor P2b is being turned off. Since much less current is now being supplied to node 3, it can be fully discharged to 0 volts. As $V_4$ increases to $V_C$ volts and $V_2$ and $V_3$ decrease, transistor N3 is again turned on and its conduction path, which is in parallel with that of transistor N2, provides an even lower impedance path between nodes 3 and 2. This enables the even faster discharge of node 3, ensuring the full turn off of transistors N1b and P2b and the full turn on of transistor P1b. The circuit then settles in the stable state, which is identical to the state initially assumed, i.e. $V_{IN}$ = 5 volts, $V_2$ = 0 volts, $V_3$ = 0 volts, $V_4$ = +15 volts.

In the steady state just described, transistor P1a, P2b, and N1b are turned off. As a result, no current (except for leakage) flows in latch circuits 10 and/or 12 and, since no current is supplied into nodes 2 and/or 3, no current flows between nodes 2 and 3.

It has thus been shown that an input signal varying between zero and 5 volts can be level shifted to produce an output at $V_4$ varying between zero and 15 volts. Since there are only two stage delays (latched 10 and 12), the circuit can provide fast operation with power being dissipated only during the transition between states.

The regenerative feedback provided by transistor P2b insures that, when the 5 volts level is applied to the input of latch 12, the inverter input is eventually driven to 15 volts and the output to zero volts. The regenerative feedback is important since it causes the latch circuit 12 to store the information when the gating transistor N3 is turned off following the transition setting circuit 12 to described state. The regenerative feedback is also important since it causes the inverter input to go to 15 volts, which cuts off transistor P1b thereby eliminating any conduction path between the power supply terminals 20 and 22 via latch 12.

The importance of turning off N3 during the steady state has already been discussed and need not be repeated. When $V_4$ is high, transistor N3 is overdriven and remains in that condition, capable of passing sufficient signal between nodes 2 and 3 to cause $V_4$ to decrease. It is only after $V_4$ decreases below a given level that transistor N3 is turned off. But, by then, transistor P2b is turned on and circuit 12 is latched to $V_4$ — low and $V_3$ — high.

Thus, in response to input signals which are intermediate the operating voltages (0 and 15 volts) applied to the circuit, output signals are produced which swing between the levels of the operating voltages without dissipating power in the steady state.

In the circuit of FIG. 1, if the input signal swings between $V_A$ and $V_B$ volts, there is no need for transistor P2a. However, if the input signal varies between $V_A$ and a level intermediate $V_A$ and $V_B$, P2a is needed to drive the input to $V_B$ volts and fully turn off transistor P1a. Thus, if the signal applied to input terminal, node 1, varies between $V_A$ and a level intermediate $V_A$ and $V_B$ latch 10 will level shift the signal between $V_A$ and $V_B$ and latch 12 will then level shift the signal between $V_A$ and $V_C$.

Figure 2:
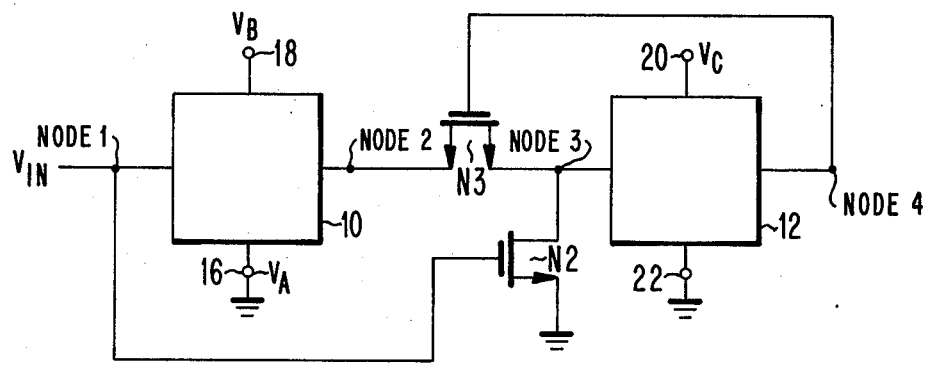
FIGS. 2, 3, 4 and 5 are schematic diagrams of other level shift circuits embodying the invention.

In FIG. 2, the conduction path of transistor N2 is connected between node 3 and ground potential instead of between nodes 2 and 3 as shown in FIG. 1. This enables node 3 to be more tightly clamped to ground potential when the input is high. But, the circuit of FIG. 2 is somewhat more susceptible to positive going noise pulses than the circuit of FIG. 1 (i.e. the noise immunity of the circuit of FIG. 2 is less than that of FIG. 1).

Figure 3:
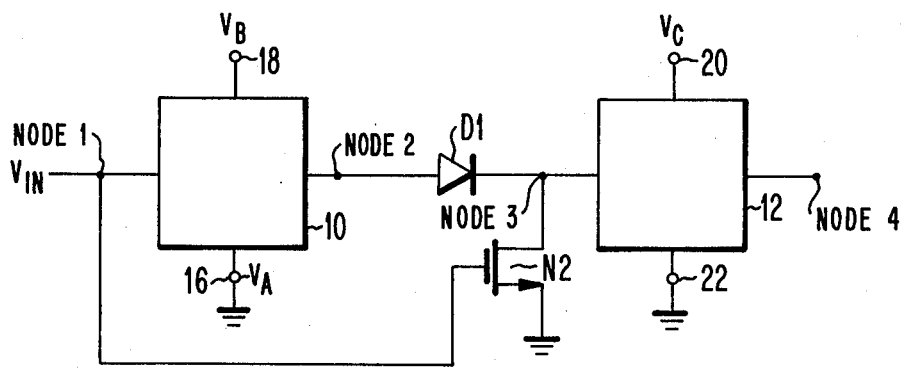

In FIG. 3, a diode D1 is connected between nodes 2 and 3 instead of a transistor N3 as shown in FIGS. 1 and 2. The use of the diode eliminates the need for a connection between the gating element and the output of latch 12 to ensure its turn-off when the inverter I2 input goes above $V_B$ volts. But, the diode introduces a voltage drop in the signal path when the positive going signal $V_B$ is applied to the input of latch 12. This may be disadvantageous where $V_B$ is very low, for the potential coupled to node 3 must be sufficiently positive with respect to $V_A$ to turn on transistor N1b, decrease the conduction of transistor P1b, and turn on transistor P2b. Otherwise, latch 12 cannot be switched and latched to the desired condition.

Figure 4:
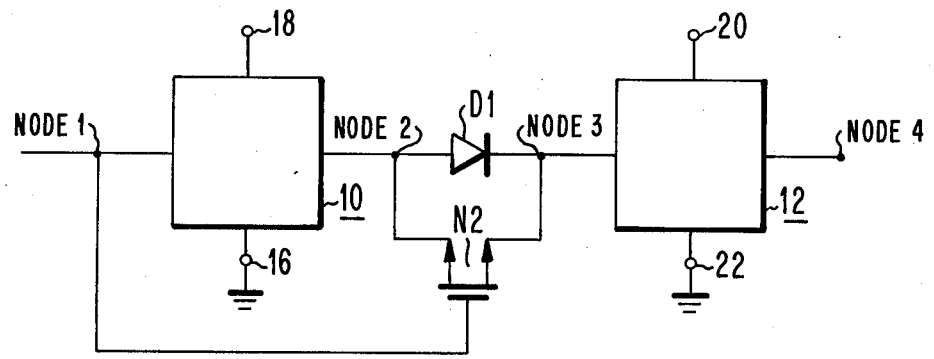

In FIG. 4, a diode D1 is connected between nodes 2 and 3 and the conduction path of transistor N2 is connected between nodes 2 and 3, with its gate connected to node 1. The operation of the circuits of FIGS. 2, 3 and 4 is similar generally to that described for the circuit of FIG. 1 and need not be repeated.

Figure 5:
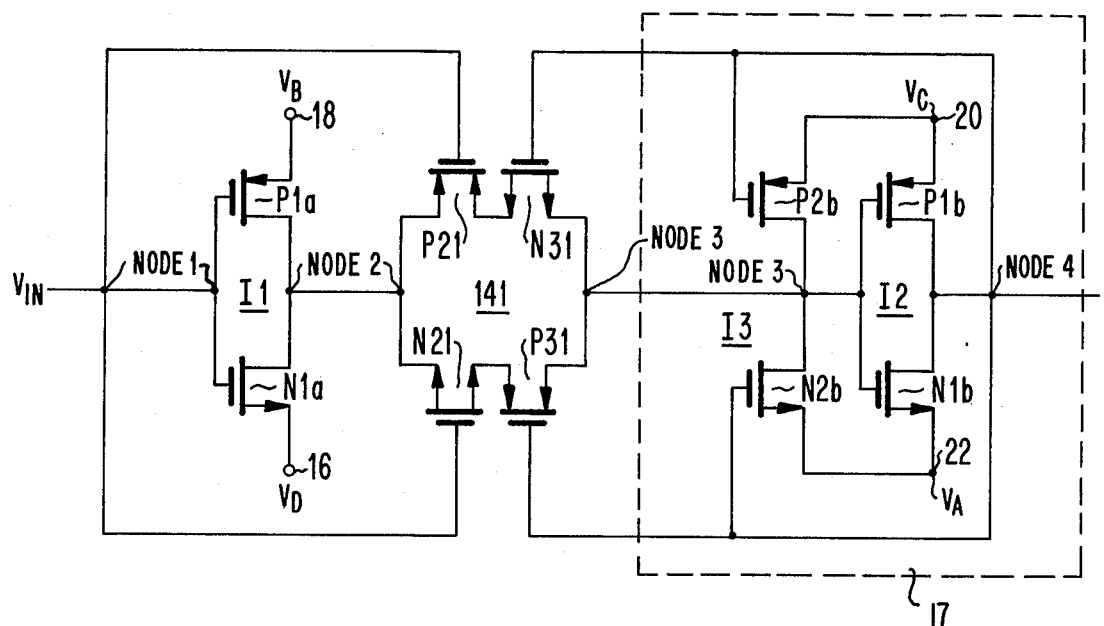

The circuit of FIG. 5 includes an inverter I1 connected at its input to node 1, at its output to node 2 and whose operating voltages are $V_D$ and $V_B$ volts. Node 2 is coupled to node 3 by means of gating network 141 which is comprised of two parallel conduction paths. One path includes the conduction paths of transistors P21 and N31 connected in series. The other path includes the conduction paths of transistors N21 and N31 connected in series. The gates of transistors P21 and N21 are connected to node 1 and are, therefore, controlled by $V_{IN}$. The gates of transistors P31 and N31 are connected to node 4 and are, therefore, controlled by $V_4$.

Latch circuit 17 is connected at its input to node 3 and at its output to node 4. The circuit is connected between power terminals 20 and 22 to which are applied $V_C$ and $V_A$ volts respectively. Latch circuit 17 includes two inverters I2 and I3 which are cross coupled to form a full-latch (or bistable stage) circuit. Transistor P2b of inverter I3 provides a conduction path between node 3 and terminal 20 and transistor N2b provides a conduction path between node 3 and terminal 22. The gates of transistors P2b and N2b are connected to node 4. Transistors P2b and N2b are extremely high impedance devices. In the discussion below, it is assumed that the "ON" impedance of each is typically 100 times greater than the "ON" impedance of any other transistor in the circuit.

In the discussion to follow, assume that $V_D = +5$ volts, that $V_B = +10$ volts, that $V_C = +15$ volts, that $V_A = 0$ volts, and that $V_{IN}$ varies between 5 and 10 volts. It will be shown that the circuit of FIG. 5 can shift the 5 and 10 volt input signals at node 1 to zero and 15 volts, respectively, at output node 4.

The operation of the circuit of FIG. 5 may be explained by arbitrarily selecting an initial state and then going through an operating cycle.

Assume initially, that $V_{IN}$ is 5 volts, that $V_2$ is at 10 volts, that $V_3$ is at 15 volts, and that $V_4$ is at 0 volts.

When $V_{IN}$ is equal to 5 volts, transistor N1a is turned off while transistor P1a is turned on and clamps node 2 at 10 volts. Transistors P21 and N21 have 5 volts at their gates and 10 volts at their sources or drains (node 2), with $V_4$ at zero volt, transistor P2b is turned on, transistor N2b is turned off and node 3 is at $V_C$ volts.

With $V_4$ at zero volts transistor N31 is turned off, preventing conduction between nodes 2 and 3 through transistor P21. Transistor P31, with zero volts at its gate, is turned on and causes the application of 15 volts to one end of the conduction path of transistor N21. But transistor N21 which now has 5 volts applied to its gate, 10 volts applied to its source and 15 volts applied to its drain is non-conducting Latch 17 is decoupled from input node 2 and no quiescent current flows.

A transition occurs when $V_{IN}$ goes from 5 volts to 10 volts. As $V_{IN}$ makes its positive going transition, transistor P1a turns off, transistor N1a turns on and $V_2$ decreases from 10 volts to 5 volts. Concurrently, transistor P21 is turned off and transistor N21 is turned on. Since initially $V_4$ is still at 0 volts, transistor P31 is turned on, and the decreasing level at node 2 is coupled via transistor N21 and P31 into node 3. During the transition there exists a conduction path between power terminals 20 and terminal 16 via the conduction paths of transistors P2b, P31, N21 and N1a. Assume, for ease of explanation, that the impedance of the conduction path of each one of transistors P31, N21 and N1a is equal to that of the other and one hundreth that of transistor P2b. With 15 volts and 5 volts at terminals 20 and 16, respectively, the potential at node 3 goes below 7 ½ volts. Assume also, that inverter I2 is designed to switch at approximately midway between $V_D$ and $V_B$ volt (e.g. 7 ½ volts). With $V_3$ less than 7 ½ volts, transistor P1b conducts more than transistor N1b, causing $V_4$ to rise from 0 volts towards 15 volts. The rising $V_4$ potential causes transistor P2b to conduct less and transistor N2b to be turned on harder. This has the effect of further reducing the potential at node 3 and accelerating the turn on of transistor P1b. This causes the rapid turn off of transistor N1b and the rise of $V_4$ to $V_C$ volts which, in turn, causes transistor P2b to turn off and transistor N2b to turn full on. Node 3 is then pulled down to $V_D$ (0 volts) and latch circuit 17 is set with $V_4$ at 15 volts and $V_3$ at 0 volts.

With $V_4$ at $V_C$ volts, transistor P31 is turned off and transistor N31 is turned on. But, with $V_{IN}$ at 10 volts, transistor P21 is turned off. There is, therefore, no conduction path between nodes 2 and 3. Therefore, with $V_{IN}$ at 10 volts $V_2$ is at 5 volts, $V_3$ is at zero volts and $V_4$ is at 15 volts.

There is (except for leakage currents) substantially no steady state power dissipation since: (a) transistor P1a is cut off; (b) there is no conduction path between nodes 2 and 3; and (c) transistor P2b and N1b are turned off.

Another transition occurs when $V_{IN}$ goes from 10 volts to 5 volts. As $V_{IN}$ makes its negative going transition, transistor P1a turns on, transistor N1a turns off, and $V_2$ goes from 5 volts to 10 volts. Concurrently, transistor P21 turns on. Since $V_4$ is at $V_C$ volts, transistor N31 is turned on. Current flows from terminal 18 (at 10 volts) through transistors P1a, P21, N31 and via transistor N2b to power terminal 22 at 0 volts. Since the "ON" impedance of transistor N2b is assumed to be 100 times the impedance of each one of transistors P1a, P21 and N31, the potential at node 3 rises quickly from close to 0 volts to more than 7 ½ volts. Since inverter I2 switches at approximately 7 ½ volts, the potential at node 4 decreases rapidly towards ground, turning on transistor P2b and decreasing the conductivity of transistor N2b. As $V_4$ decreases, transistor N31 begins to cut off. But, by that time, the regenerative feedback provided by P2b drives $V_4$ to ground and $V_3$ to $V_C$ volts. This reestablishes the conditions assumed initially that with $V_{IN}$ at 5 volts, $V_2$ goes to 10 volts, $V_3$ goes to 15 volts and $V_4$ goes to zero volts.

What is claimed is:

1. The combination comprising:

first, second, and third power terminals for the application thereto of first, second, and third operating voltages, respectively; said second voltage having a value intermediate the values of said first and third voltages;

an input node adapted to receive input signals making transitions between a first level, corresponding to said first voltage, and a second level;

first and second inverters, each inverter having an input, an output, and two power terminals;

means coupling said first and second power terminals to respective ones of said two power terminals of said first inverter; means connecting the input of said first inverter to said input node, the output of said first inverter being clamped to said first voltage when the input signal is at said second level and being clamped to said second voltage when the input signal is at said first level;

means coupling said first and third power terminals to respective ones of said two power terminals of said second inverter;

a first gating means connected between the output of said first inverter and the input of said second inverter for coupling to the input of the second inverter, via a low impedance path, the voltage transitions, at the output of the first inverter, going from said first voltage to said second voltage; said first means exhibiting a high impedance and being nonconductive when the output of said second inverter is at said first voltage and its input is at said third voltage;

regenerative feedback means, connected between the output and the input of said second inverter, for driving the input of said second inverter to the voltage at said third power terminal and setting its output to the voltage at said first power terminal in response to the application to said second inverter of said transitions going from said first voltage to said second voltage; and a second gating means including a transistor having a conduction path and a control electrode, means connecting said control electrode to said input node and means connecting said conduction path between the input of said second inverter and said first power terminal for clamping the input of said second inverter to said first voltage when the input signal is at said second level.

2. The combination as claimed in claim 1 wherein said first means includes an insulated-gate field-effect transistor (IGFET) having source and drain electrodes defining the ends of a conduction path and having a gate electrode whose applied potential determines the conductivity of said conduction path; said gate electrode being connected to the output of said second inverter, and the conduction path of said IGFET being connected between the output of said first inverter and said input of said second inverter.

3. The combination as claimed in claim 2 wherein said transistor of said second means is a second IGFET having its source-to-drain conduction path connected in parallel with the IGFET of said first means; and wherein the gate electrode of said second IGFET is said control electrode of said transistor; and wherein said first and second IGFETs are of the same conductivity type.

4. The combination as claimed in claim 3 wherein said first inverter includes regenerative feedback means coupled between its output and its input for driving said output of said first inverter to the voltage at one of its two power terminals and driving said input of said first inverter to the voltage at the other one of its two power terminals in response to a second level signal at said input node having a value intermediate said first and second voltages.

5. The combination as claimed in claim 2 wherein said transistor of said second means is an IGFET having its source-to-drain conduction path directly connected between said input of said second inverter and a point to which is applied said first operating voltage, and having its gate electrode connected to said input node.

6. The combination as claimed in claim 1 wherein said first means includes a unidirectionally conducting element connected between said output of said first inverter and said input of said second inverter.

7. The combination as claimed in claim 6 wherein said transistor of said second means is an insulated-gate field-effect transistor (IGFET) having its source-to-drain conduction path connected between said input of said second inverter and a point to which is applied said first operating voltage.

8. The combination as claimed in claim 6 wherein said transistor of said second means is an insulated-gate field-effect transistor (IGFET) having its source-to-drain conduction path connected between said output of said first inverter and said input of said second inverter; and wherein the gate electrode of said IGFET is connected to said input node.

9. A level shift circuit comprising:
first, second, third and fourth power terminals for the application thereto of first, second, third and fourth operating voltages, respectively, the levels of said first and second voltages being intermediate the levels of said third and fourth voltages;

an input node adapted to receive signals making transitions between first and second levels, intermediate the levels of said third and fourth operating voltages;

first and second inverters, each inverter having an input and an output and two power terminals for the application therebetween of an operating voltage;

means for applying said first and second voltages to respective ones of the two power terminals of the first inverter; means for applying the input of said first inverter to said input node;

means for applying said third and fourth voltages to respective ones of the two power terminals of the second inverter;

regenerative feedback means connected between the input and the output of said second inverter; and gating means comprising two parallel paths connected between the output of said first inverter and the input of said second inverter, each path including two IGFETs having their conduction paths connected in series; with the gate electrode of one transistor of each path being connected to the output of said second inverter and the gate electrode of the other transistor of each path being connected to said input node.

10. The level shift circuit as claimed in claim 9 wherein one transistor in each of said parallel paths is of one conductivity type and the second transistor in each of said parallel paths is of opposite conductivity type.

11. The level shift circuit as claimed in claim 9 wherein said regenerative feedback means includes an inverting stage connected at its input to said output of said second inverter and connected at its output to said input of said second inverter and wherein said inverting stage is connected between said first and third operating voltages.

12. A level shift circuit comprising:
a first inverter operated from a first operating voltage;

a second inverter operated from a second operating voltage which exceeds the range of the first operating voltage;

an input node adapted to receive input signals within the range of the first operating voltage;

means connecting the input of the first inverter to the input node;

a first transistor having its conduction path connected between the output of the first inverter and the input to the second inverter and having its control electrode connected to the output of the second inverter; and a second transistor having its conduction path connected between the input of the second inverter and one of the voltages providing said first operating voltage, and having its control electrode connected to the input node.

* * * * *